(12) United States Patent
Kim (10) Patent No.: US 7,989,909 B2
(45) Date of Patent: Aug. 2, 2011

(54) IMAGE SENSOR MODULE AND METHOD OF MANUFACTURING THE SAME

(75) Inventor: Sung Min Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/329,814

(22) Filed: Dec. 8, 2008

(65) Prior Publication Data
US 2010/0084694 A1   Apr. 8, 2010

(30) Foreign Application Priority Data
Oct. 8, 2008 (KR) .................. 10-2008-0098755

(51) Int. Cl.
*H01L 31/0224* (2006.01)
*H01L 31/02* (2006.01)

(52) U.S. Cl. ... 257/459; 257/433; 257/448; 257/E31.11; 257/E31.124

(58) Field of Classification Search .................. 257/433, 257/448, 459, E31.11, E31.124
See application file for complete search history.

(56) References Cited

U.S. PATENT DOCUMENTS
| 2008/0001241 | A1 | 1/2008 | Tuckerman et al. |
| 2009/0166785 | A1* | 7/2009 | Camacho et al. ............. 257/433 |

FOREIGN PATENT DOCUMENTS
| KR | 1020060052055 A | 5/2006 |
| KR | 1020070067634 A | 6/2007 |
| KR | 1020070103555 A | 10/2007 |
| WO | 2008/108970 A2 | 9/2008 |

* cited by examiner

*Primary Examiner* — Victor Mandala
(74) *Attorney, Agent, or Firm* — Ladas & Parry LLP

(57) ABSTRACT

An image sensor module includes a semiconductor chip. Photodiode units are disposed in an active region of the semiconductor chip to convert light into electric signals. Pads are disposed in a peripheral region formed around the active region and the pads are electrically connected to the photodiode units. A connecting region is formed around the peripheral region. Re-distribution layers are electrically connected to respective pads and extend to the connecting region. A transparent substrate covers the photodiode units and the pads and exposes at least a portion of the re-distribution layers. Connecting layers are electrically connected to the respective re-distribution layers and extend to a top surface of the transparent substrate. Connecting members are connected to the respective connecting layers disposed on the top surface of the transparent substrate.

15 Claims, 6 Drawing Sheets

IMAGE SENSOR MODULE AND METHOD OF MANUFACTURING THE SAME

CROSS-REFERENCE TO RELATED APPLICATIONS

The present application claims priority to Korean patent application number 10-2008-0098755 filed on Oct. 8, 2008, which is incorporated herein by reference in its entirety.

BACKGROUND OF THE INVENTION

The present invention relates generally to an image sensor module and a method of manufacturing the same, and more particularly to an image sensor module having a reduced size.

An image sensor module is a device that converts an analog optical signal into an electric signal.

The image sensor module generally includes a semiconductor chip having image sensors formed on an upper surface thereof, a glass substrate attached on the bottom surface of the semiconductor chip, an interconnection extending to the bottom surface of the glass substrate along a side surface of the glass substrate from the top surface of the semiconductor chip, and a connecting member connected to the interconnection.

The image sensors include photodiodes that receive incident light and generate photocharges corresponding to the amount of the incident light, driving units that output electric signals corresponding to photocharges generated from the respective photodiodes, color filters disposed on the respective photodiodes, and a lens unit disposed on the respective color filters.

In a conventional image sensor module, a connecting member is disposed at the position opposite to the top surface of a semiconductor chip, onto which light is incident. The connecting member is electrically connected to an external circuit substrate and the like.

However, configuring the image sensor module conventionally and disposing the connecting member at the position opposite to the top surface of the semiconductor chip, the size of the image sensor module is considerably increased. Further, it is difficult apply the conventional image sensor module to the structure in which a circuit substrate is disposed at the position opposite to the top surface of a semiconductor chip.

SUMMARY OF THE INVENTION

Embodiments of the present invention include an image sensor module having a reduced size by modifying its structure, and a method of manufacturing the same.

In one embodiment, an image sensor module comprises a semiconductor chip comprising photodiode units disposed in an active region to convert light into electric signals, pads disposed in a peripheral region formed around the active region and electrically connected to the photodiode units, and a connecting region formed around the peripheral region; re-distribution layers electrically connected to the respective pads and extended to the connecting region; a transparent substrate covering the photodiode units and the pads, and exposing at least portions of the re-distribution layers; connecting layers electrically connected to the respective re-distribution layers and extended to a top surface of the transparent substrate; and connecting members connected to the respective connecting layers disposed on the top surface of the transparent substrate.

Each of the photodiode units comprises a photodiode converting light into electric signals, a driving unit having a driving transistor driving the photodiode, a color filter disposed on the photodiode, and a condensing member disposed on the color filter.

The transparent substrate includes any one of a transparent glass substrate, a transparent quartz substrate and a transparent synthetic resin substrate.

The angle made by the top surface of the transparent substrate and a side surface connected to the top surface of the transparent substrate is an obtuse angle.

The image sensor module further comprises a transparent adhesion member interposed between the transparent substrate and the semiconductor chip.

The image sensor module further comprises at least one lens unit disposed at a portion of the top surface of the transparent substrate, corresponding to the active region.

The image sensor module further comprises a circuit substrate having an opening exposing the active region and connecting pads disposed around the opening and electrically connected to the respective connecting members.

The image sensor module further comprises a holder surrounding the semiconductor chip and the circuit substrate, and having an opening exposing the opening of the circuit substrate.

The transparent substrate comprises a first transparent substrate portion corresponding to the active region and a second transparent substrate portion corresponding to the peripheral region, and the first transparent substrate portion has a first thickness and the second transparent substrate portion has a second thickness lower than the first thickness.

In another embodiment, an image sensor module comprises a semiconductor chip comprising photodiode units disposed in an active region to convert light into electric signals, and pads disposed in a peripheral region formed around the active region and electrically connected to the photodiode units; a transparent substrate comprising a transparent substrate body covering the photodiode units and the pads and having through-holes exposing at least portions of the pads, and through-electrodes electrically connected to the respective pads exposed through the through-holes; and connection members connected to the respective through-electrodes.

The transparent substrate includes any one of a transparent glass substrate, a transparent quartz substrate and a transparent synthetic resin substrate.

The image sensor module further comprises a transparent adhesion member interposed between the transparent substrate and the semiconductor chip.

The image sensor module further comprises at least one lens unit disposed at a portion of a top surface of the transparent substrate, corresponding to the active region.

The image sensor module further comprises a circuit substrate having an opening exposing the active region and connecting pads disposed around the opening and electrically connected to the respective connecting members.

The image sensor module further comprises a holder surrounding the semiconductor chip and the circuit substrate, and having an opening exposing the opening of the circuit substrate.

The transparent substrate comprises a first transparent substrate portion corresponding to the active region and a second transparent substrate portion corresponding to the peripheral region, and the first transparent substrate portion has a first thickness and the second transparent substrate portion has a second thickness lower than the first thickness.

In still another embodiment, a method of manufacturing an image sensor module comprises forming first and second photodiode units converting light into electric signals in first and second active regions of first and second semiconductor chips disposed at both sides of a scribe region, respectively, and forming first and second pads electrically connected to the first and second photodiode units in first and second peripheral regions formed around the first and second active regions, respectively; forming connecting layers electrically connecting the first and second pads while crossing the scribe region; covering the first and second photodiode units, the first and second pads and the connecting layers with a transparent substrate; etching the transparent substrate to expose the connecting layers corresponding to the scribe region; forming re-distribution layers having one ends electrically connected to the respective connecting layers and the other ends opposite to the one ends, extended to a top surface of the transparent substrate opposite to the first and second pads; and individualizing the first and second semiconductor chips along the scribe region.

The first and second pads are formed opposite to each other at both sides of the scribe region.

The covering with the transparent substrate further comprises coating a transparent adhesion member between the transparent substrate and the semiconductor chip.

In the exposing of the connecting layers, an obtuse angle is made by an angle made by a side surface of the transparent substrate connected to the exposed connecting layer and the top surface of the transparent substrate.

After forming the re-distribution layers, the method further comprises forming an organic layer having an opening covering the connecting layers and the re-distribution layers and exposing portions of the re-distribution layers.

The method further comprises attaching connecting members on the respective re-distribution layers exposed by the opening.

DESCRIPTION OF SPECIFIC EMBODIMENTS

Figure 1:
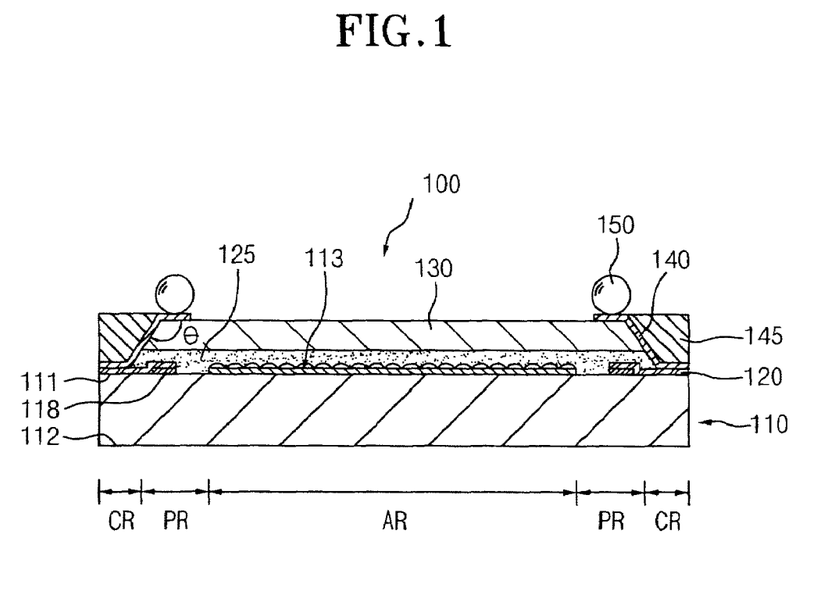
FIG. 1 is a cross-sectional view of an image sensor module in accordance with an embodiment of the present invention.

FIG. 1 is a cross-sectional view of an image sensor module in accordance with an embodiment of the present invention.

Referring to FIG. 1, the image sensor module 100 comprises a semiconductor chip 110, re-distribution layers 120, a transparent substrate 130, connecting layers 140, and connecting members 150.

The semiconductor chip 110 may be defined by six substantially planar surfaces, for example the semiconductor chip 110 may have a rectangular parallelepiped shape. The semiconductor chip 110 having a rectangular parallelepiped shape includes a top surface 111 and a bottom surface 112 opposite the top surface 111.

An active region AR, a peripheral region PR and a connecting region CR are formed on the top surface 111 of the semiconductor chip 110.

The active region AR is formed at a central portion of the top surface 111 of the semiconductor chip 110. The peripheral region PR is formed in a band shape around the active region AR. The connecting region CR is formed in a band shape around the peripheral region PR.

Figure 2:
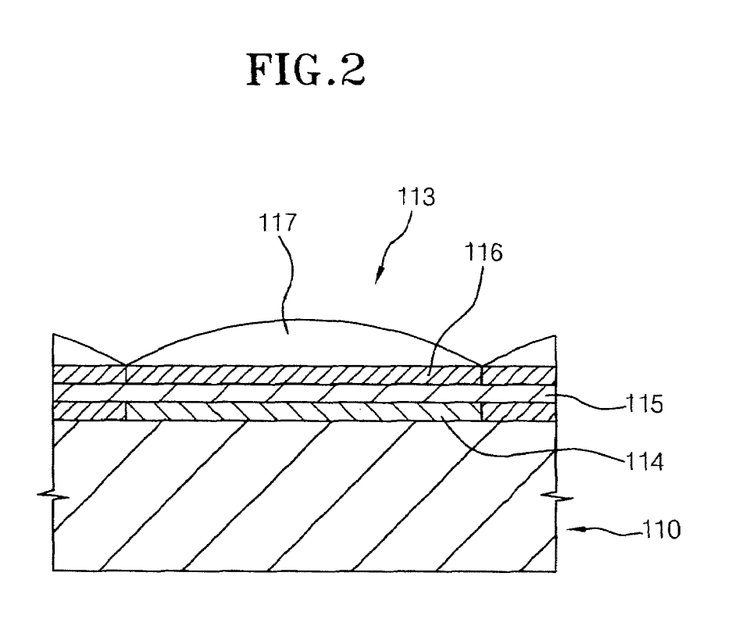
FIG. 2 is a cross-sectional view of a photodiode unit shown in an active region.

FIG. 2 is a cross-sectional view of a photodiode unit shown in an active region.

Photodiode units 113 are disposed in the active region AR. The photodiode units 113 comprise photodiodes 114, driving units (not shown), a planarization layer 115, color filters 116, and lens units 117.

A plurality of photodiodes 114 are disposed in a matrix form (i.e., an A×B array) within the active region AR. For example, when the resolution of the image sensor module 100 is 1,024×768, 1,024×768×3 photodiodes 114 are disposed in a matrix form.

The driving units are electrically connected to the respective photodiodes 114 disposed in the active region AR. For example, the driving units may include a plurality of driving transistors.

The planarization layer 115 covers the photodiodes 114 disposed in the active region AR. For example, the planarization layer 115 may include an organic layer.

The color filters 116 are disposed on the planarization layer 115. The color filters 116 comprise red, green, and blue color filters. White light is filtered into red light by a red color filter. White light is filtered into green light by a green color filter. White light is filtered into blue light by a blue color filter. The red, green, and blue color filters are alternately disposed on the respective photodiodes 114.

Pads 118, shown in FIG. 1), are disposed in the peripheral region PR. For example, the pads 118 may be symmetrically disposed on both sides of the peripheral region PR. The pads 118 are electrically connected to the photodiode units 113.

When viewed from above, the re-distribution layers 120 have a line shape. An end of each of the re-distribution layers 120 is electrically connected to a pad 118, respectively. An opposite end of each of the re-distribution layers 120 is extended to the connecting region CR. In the present embodiment, the re-distribution layer 120 may include a material having excellent conductivity, for example copper.

The transparent substrate 130 covers the photodiode units 113, disposed in the active region AR, and the pads 118, disposed in the peripheral region PR. For example, the transparent substrate may be any one of a transparent glass substrate, a transparent quartz substrate, and a transparent synthetic resin substrate.

The transparent substrate 130 has a plurality of side surfaces including side surfaces extending to the re-distribution layers 120 are defined as inclined side surfaces. The angle θ made by each of the inclined side surfaces and the top surface of the transparent substrate 130 may be, for example, an obtuse angle.

An adhesion member 125 is interposed between the transparent substrate 130 and the semiconductor chip 110. The adhesion member 125 may include a transparent adhesive material. In this embodiment, the adhesion member 125 may be a transparent epoxy adhesive. In the present embodiment, the adhesion member 125 covers the photodiode units 113, disposed in the active region AR of the semiconductor chip 110, and the pads 118, disposed in the peripheral region PR. Therefore, portions of the re-distribution layers 120, extending to the connecting region CR, are exposed from the adhesion member 125.

When viewed from above, the connecting layers 140 have a line shape. An end of each of the connecting layers 140 is electrically connected to a portion of a respective re-distribution layer 120 disposed in the connecting region CR. The opposite end of each of the connecting layers 140 is extended to the top surface of the transparent substrate 130 along the inclined side surface of the transparent substrate 130. A land portion (not shown) having the shape of a disk may be formed at the opposite end of each of the connecting layers 140. The connecting member 150 is attached on the disk-shaped land portion.

The image sensor module 100 may further include a resist pattern 145. The resist pattern 145 is formed in both the peripheral region PR and the connecting region CR, but is not formed in the active region AR. The resist pattern 145 covers the connecting layers 140 disposed in the peripheral region PR and the connecting region CR, and the resist pattern 145 has an opening through which the land portion is exposed.

The connecting member 150 is electrically connected to the land portion formed at the opposite end of each of the connecting layers 140 on the top surface of the transparent substrate 130. In this embodiment, the connecting member 150 may be a conductive ball including a metal with a low melting point, such as solder. As should be understood, according to the present invention the connecting member 150 may alternatively have a plate shape rather than a spherical shape discussed above.

Figure 3:
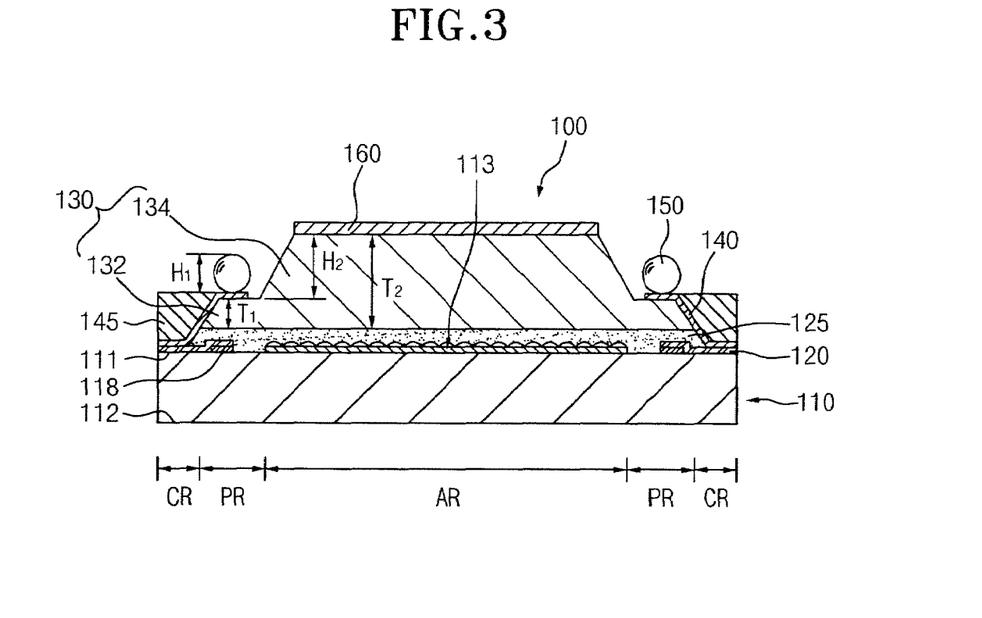
FIG. 3 is a cross-sectional view of an image sensor module in accordance with another embodiment of the present invention.

FIG. 3 is a cross-sectional view of an image sensor module in accordance with another embodiment of the present invention. The image sensor module according to the present embodiment of has a configuration substantially identical to the image sensor module described with reference to FIGS. 1 and 2, with the exception of a transparent substrate and a lens unit. Therefore, descriptions of the same components will be omitted, and like elements are designated by like reference numerals.

Referring to FIG. 3, the image sensor module 100 comprises a semiconductor chip 110, re-distribution layers 120, a transparent substrate 130, connecting layers 140, connecting members 150, and a lens unit 160.

The transparent substrate 130 is disposed on an active region AR and a peripheral regions PR of the semiconductor chip 110, and the transparent substrate 130 comprises a first transparent substrate portion 132 and a second transparent substrate portion 134.

In this embodiment, the first transparent substrate portion 132 is disposed at the position corresponding to the peripheral region PR, and the second transparent substrate portion 134 is disposed at the position corresponding to the active region AR.

The first transparent substrate portion 132 has a first thickness T1 when measured from the bottom surface of the transparent substrate 130. The second transparent substrate portion 134 has a second thickness T2 that is thicker than the thickness T1 when measured from the bottom surface of the transparent substrate 130. In the present embodiment, the thickness T2 of the second transparent substrate portion 134 is determined by a focus length of the lens unit 160 which will be described later.

The connecting layer 140 is disposed on the first transparent substrate portion 132 of the transparent substrate 130. The connecting member 150 is disposed on the connecting layer 140 disposed on the first transparent substrate portion 132. In this embodiment, the connecting member 150 has a first height, measured from the top surface of the connecting layer 140, that is less than a second height H2 of the second transparent substrate portion 134, which is measured from the top of the first transparent substrate portion 132. If the first height H1 of the connecting member 150 is less than the second height H2 of the second transparent substrate portion 134, a circuit substrate does not protrude from the second transparent substrate portion 134, the volume and thickness of the image sensor module 100 can be decreased.

The lens unit 160 is disposed on the second transparent substrate portion 134 of the transparent substrate 130. In this embodiment, the lens unit 160 may comprise at least one lens (not shown). In the present embodiment, the lens may be a convex lens, a concave lens, or the like.

Figure 4:
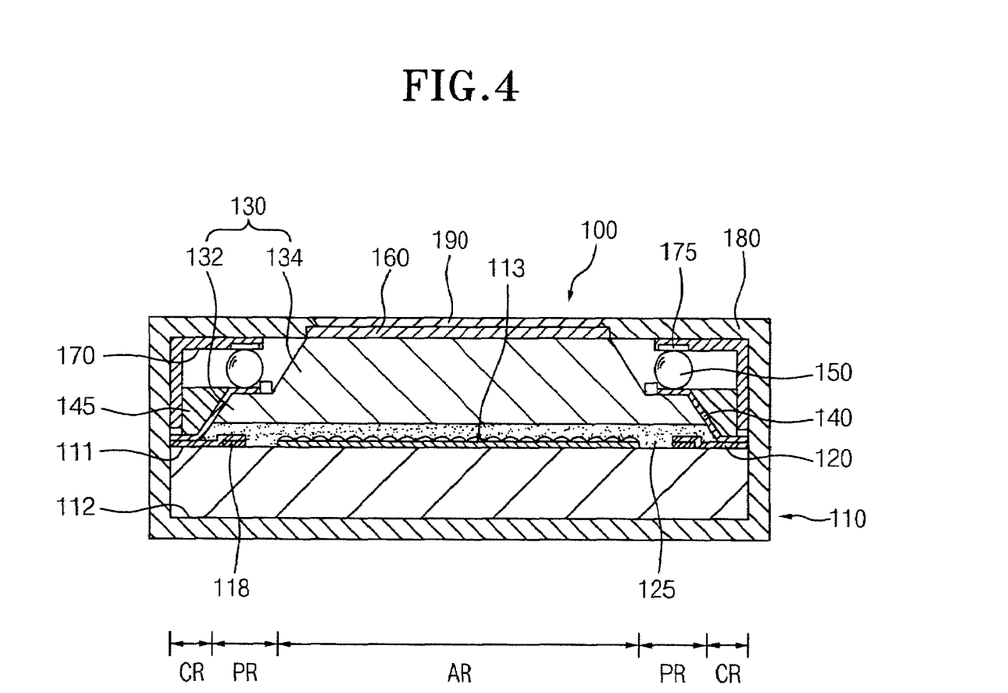
FIG. 4 is a cross-sectional view showing a circuit substrate and a holder, combined with the image sensor module of FIG. 3.

FIG. 4 is a cross-sectional view showing a circuit substrate and a holder combined with the image sensor module of FIG. 3.

Referring to FIG. 4, the image sensor module 100 may further comprise a circuit substrate 170 and a holder 180.

According to the present embodiment, the circuit substrate 170 has a plate shape. The circuit substrate 170 has an opening through which the active region AR of the semiconductor chip 110 is exposed. The circuit substrate 170 comprises connecting pads 175 disposed at positions corresponding to respective connecting members 150. The connecting pads 175 of the circuit substrate 170 are electrically connected to the respective connecting members 150. In present embodiment, the connecting member 150 is disposed at a lower position than that of the second transparent substrate portion 134 of the transparent substrate 130, therefore the circuit substrate 170 is not protruded from the second transparent substrate portion 134 of the transparent substrate 130, and the volume and thickness of the image sensor module 100 can be decreased.

The holder 180 surrounds the semiconductor chip 110, the transparent substrate 130, and the circuit substrate 170. The holder 180 has an opening through which the active region AR of the semiconductor chip 110 is exposed. A step through which the holder 180 is combined with the lens unit 160 is formed in an inner side surface of the holder 180, formed by the opening of the holder 180. As the holder 180 is combined with the lens unit 160, it is possible to prevent foreign matter, such as a foreign particles, from coming into the holder 180.

The image sensor module 100 may further comprise a protecting member 190 covering the lens unit 160 exposed by the opening of the holder 180 so as to prevent the lens unit 160 exposed by the opening of the holder 180 from being damaged.

Figure 5:
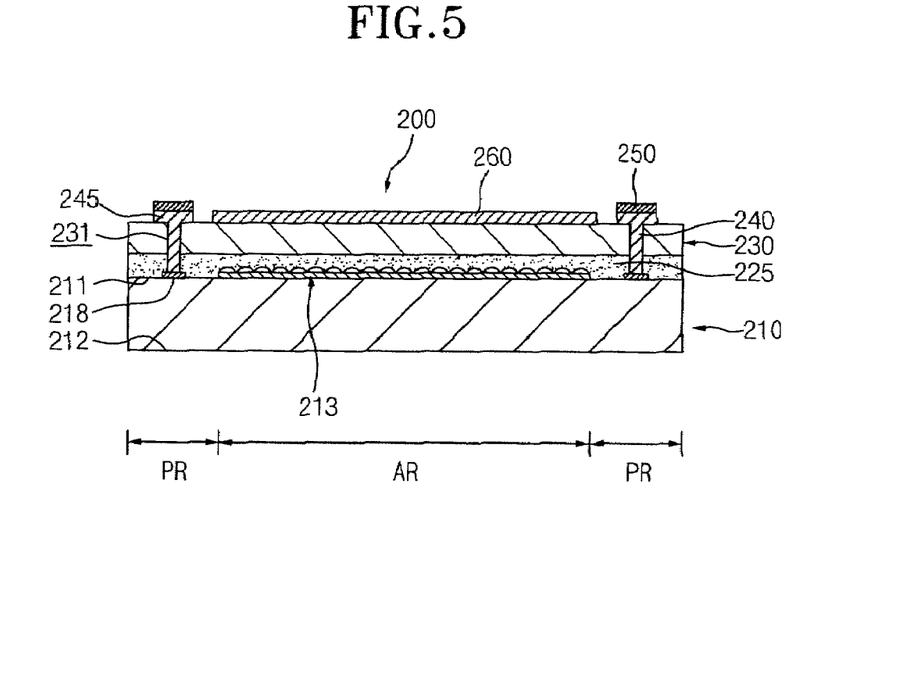
FIG. 5 is a cross-sectional view of an image sensor module in accordance with still another embodiment of the present invention.

FIG. 5 is a cross-sectional view of an image sensor module in accordance with still another embodiment of the present invention.

Referring to FIG. 5, the image sensor module 200 comprises a semiconductor chip 210, a transparent substrate 230, through-electrodes 240, and connecting members 250.

The semiconductor chip 210 is defined by six substantially planar surfaces, for example the semiconductor chip 210 may have a rectangular parallelepiped shape. The semiconductor chip 210 having a rectangular parallelepiped shape has a top surface 211 and a bottom surface 212 opposite the top surface 211.

An active region AR and a peripheral region PR are formed on the top surface 211 of the semiconductor chip 210.

The active region AR is formed at a central portion of the top surface 211 of the semiconductor chip 210. The peripheral region PR is formed in a band shape around the active region AR.

Photodiode units 213 are disposed in the active region AR. The photodiode units 213 comprise photodiodes, driving units, a planarization layer, color filters, and lens units, as shown in FIG. 2.

Pads 218 are disposed in the peripheral region PR. For example, the pads 218 may be symmetrically disposed in the peripheral region PR about the photodiode units 213. The pads 218 are electrically connected to the photodiode units 213.

The transparent substrate 230 covers both the photodiode units 213 disposed in the active region AR and the pads 218 disposed in the peripheral region PR. For example, the transparent substrate may include any one of a transparent glass substrate, a transparent quartz substrate, and a transparent synthetic resin substrate. In this embodiment, the transparent substrate 230 may have a plate shape having the same shape and size as those of the semiconductor chip 210.

The transparent substrate 230 has through-holes 231 which expose respective pads 218 disposed on the peripheral region PR of the semiconductor chip 210.

An adhesion member 225 is interposed between the transparent substrate 230, which includes the through-holes 231, and the semiconductor chip 210. The adhesion member 225 may include a transparent adhesive material. In the present embodiment, the adhesion member 225 may be a transparent epoxy adhesive. In the present embodiment, the adhesion member 225 covers the active regions AR and the peripheral regions PR of the semiconductor chip 210. The adhesion member 225 has openings which expose the respective pads 218.

The through-electrode 240 is formed in the through-hole 231 of the transparent substrate 230. The through-holes 240 are electrically connected to respective pads 218 of the semiconductor chip 210.

By way of example, the through-electrode 240 may be a conductive pin or a plating layer. For example, the through-electrode 240 may include copper. A land portion 245 may be formed at each of the through-holes 240 and disposed on the top surface of the transparent substrate 230.

The connecting member 250 is electrically connected to the land portion 245 formed on the top surface of the transparent substrate 230. In this embodiment, the connecting member 250 may be a conductive plate. Alternatively, the connecting member 250 may have a spherical shape rather than a plate shape, and may include a metal with a low melting point, such as solder.

The lens units 260 may be disposed on the top surface of the transparent substrate 230. The lens unit 260 increases the amount of light incident onto the photodiode units 213 or optical distribution. The lens unit 260 includes one or more lenses and the lens unit 260 may be a convex lens or a concave lens.

In this embodiment, the transparent substrate 230 may have a plate shape. Alternatively, the transparent substrate 230 may have a first thickness in the peripheral region PR and a second thickness greater than the first thickness in the active region AR, similar to the embodiment described with reference to FIG. 3. When the transparent substrate 230 is formed to be thick in the active region AR, a focus distance between the lens unit 260 and the photodiode unit 213 can be precisely adjusted.

Figure 6:
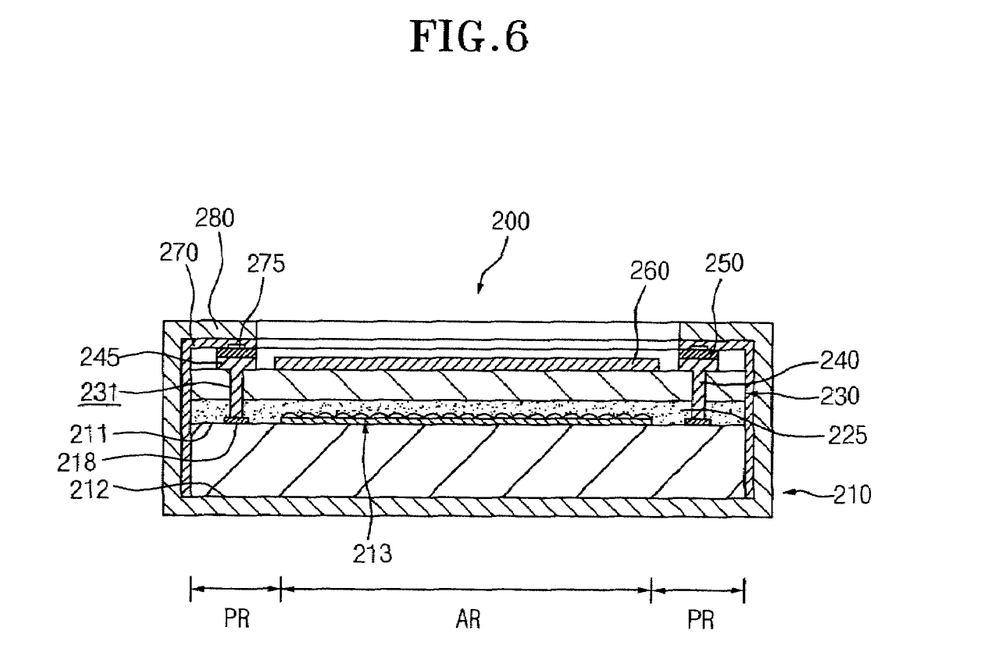
FIG. 6 is a cross-sectional view showing a circuit substrate and a holder, combined with the image sensor module of FIG. 5.

FIG. 6 is a cross-sectional view showing a circuit substrate and a holder combined with the image sensor module of FIG. 5.

Referring to FIG. 6, the image sensor module 200 may further comprise a circuit substrate 270 and a holder 280.

The circuit substrate 270 has a plate shape. The circuit substrate 270 has an opening exposing the active region AR of the semiconductor chip 210. The circuit substrate 270 comprises connecting pads 275 disposed at positions corresponding to respective connecting members 250. The connecting pads 275 of the circuit substrate 270 are electrically connected to the connecting members 250, respectively.

The holder 280 surrounds the semiconductor chip 210, the transparent substrate 230, and the circuit substrate 270. The holder 280 has an opening which exposes the active region AR of the semiconductor chip 210.

FIGS. 7 through 11 are cross-sectional views showing a method of manufacturing an image sensor module in accordance with an embodiment of the present invention.

Figure 7:
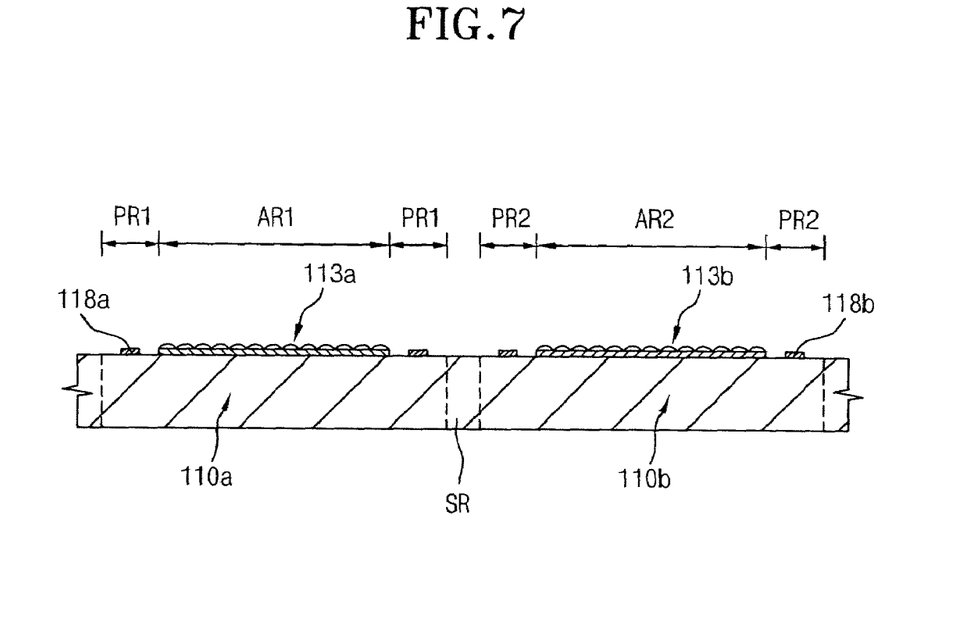
FIGS. 7 through 11 are cross-sectional views showing a method of manufacturing an image sensor module in accordance with an embodiment of the present invention.

Referring to FIG. 7, first and second photodiode units 113a and 113b for converting light into electric signals are formed in first and second active regions AR1 and AR2 of first and second semiconductor chips 110a and 110b disposed at both sides of a scribe region SR of a wafer, respectively.

Subsequently, first and second pads 118a and 118b that are electrically connected to the first and second photodiode units 113a and 113b are formed in first and second peripheral regions PR1 and PR2 disposed around the first and second active regions AR1 and AR2, respectively. In this embodiment, the first and second pads 118a and 118b are disposed opposite each other at both sides of the scribe region SR.

The first photodiode unit 113a is formed in the first active region AR1 and the second photodiode unit 113b is formed in the second active region AR2. Each of the first and second photodiode units 113a and 113b comprises photodiodes, driving units driving the photodiodes, a planarization layer covering the top surface, of the photodiode, color filters disposed on the planarization layer, and a micro-lenses disposed on the respective color filters.

Figure 8:
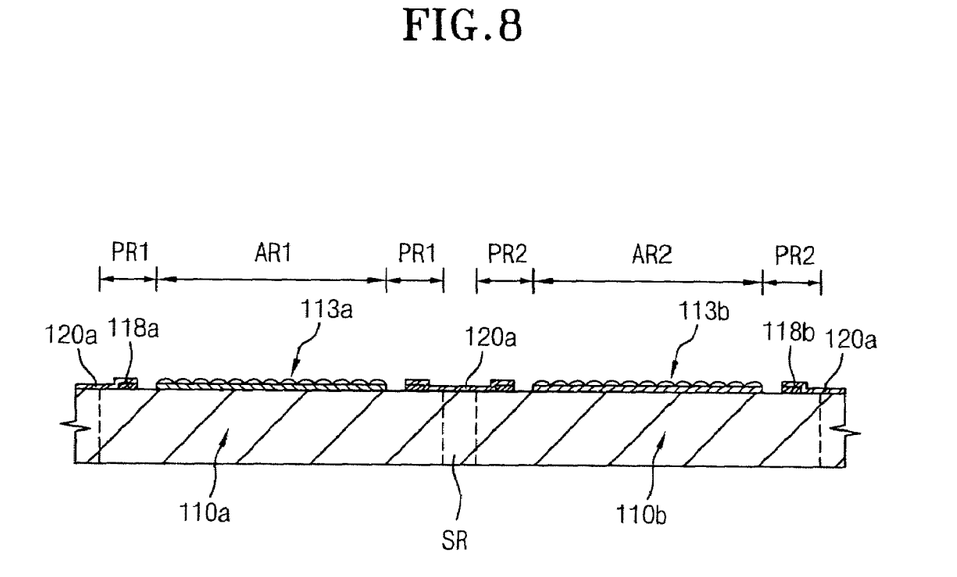

Referring to FIG. 8, preliminary connecting layers 120a connecting the first and second pads 118a and 118b disposed at both sides of the scribe region SR are formed to have a line shape. In this embodiment, the preliminary connecting layer 120a may be formed through a photolithography process or a plating process.

Figure 9:
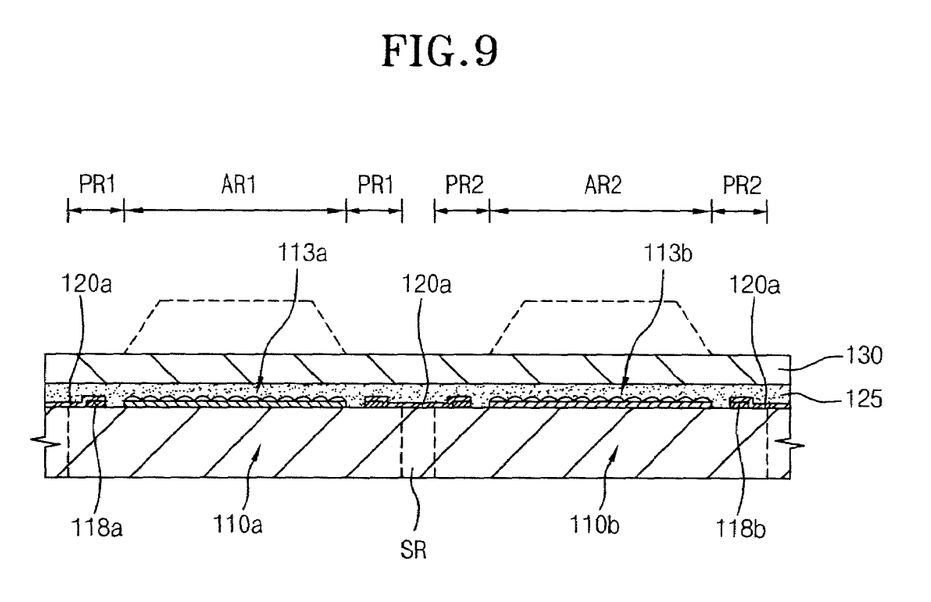

Referring to FIG. 9, after the preliminary connecting layers 120a electrically connecting the first and second pads 118a and 118b are formed, a transparent adhesion member 125 is formed on the first and second semiconductor chips 110a and 110b covering the first and second photodiode units 113a and 113b.

After the transparent adhesion member 125 is formed on the first and second semiconductor chips 110a and 110b, a transparent substrate 130 is disposed on the adhesion member 125.

In this embodiment, the transparent substrate 130 may have a plate shape. For example, the transparent substrate 130 may be any one of a transparent glass substrate, a transparent quartz substrate, and a transparent synthetic resin substrate. As an alternative to the plate shape, the transparent substrate 130 may comprise a first transparent substrate portion having a first thickness and a second transparent substrate portion having a second thickness which is greater than the first thickness. The first transparent substrate portion may be formed at a position corresponding to the scribe region SR, and the second transparent substrate portion may be formed on the first and second active regions AR1 and AR2.

Figure 10:
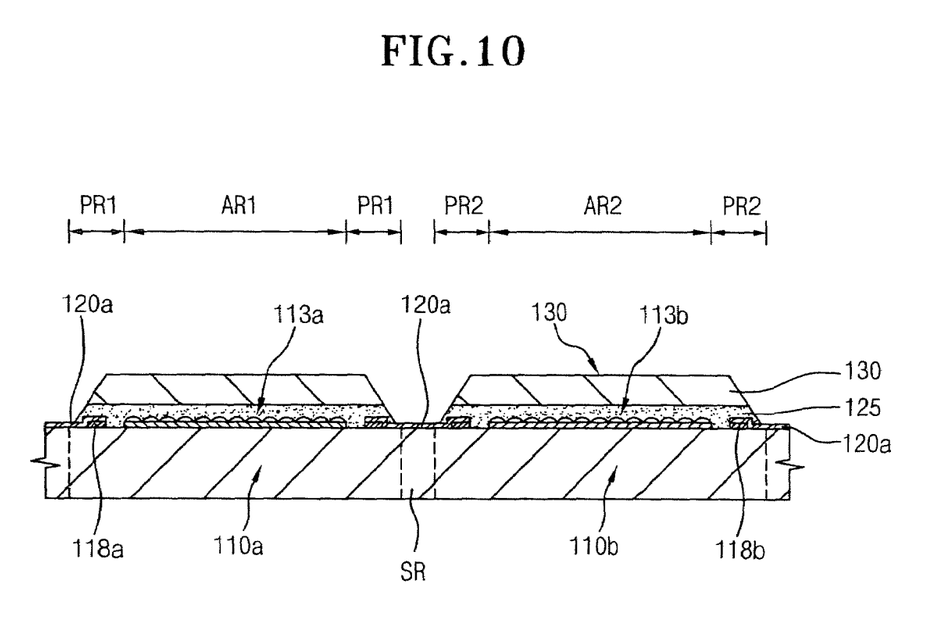

Referring to FIG. 10, after the transparent substrate 130 is attached on the first and second semiconductor chips 110a and 110b, portions corresponding to the scribe region SR in the transparent substrate 130 and the adhesion members 125 are etched through an etching process. For example, the transparent substrate 130 and the adhesion members 125 may be etched through a wet or dry etching process using an etchant. As the transparent substrate 130 and the adhesion members 125 corresponding to the scribe region SR are etched, the preliminary connecting layers 120a, disposed in the scribe region SR, are exposed from the transparent substrate 130 and the adhesion members 125.

For example, side surfaces of the etched transparent substrate 130 are formed to be inclined with respect to the top surface of the transparent substrate 130. For example, in the present embodiment, the angle made by a side surface of the transparent substrate 130 and the top surface of the transparent substrate 130 may be an obtuse angle.

Figure 11:
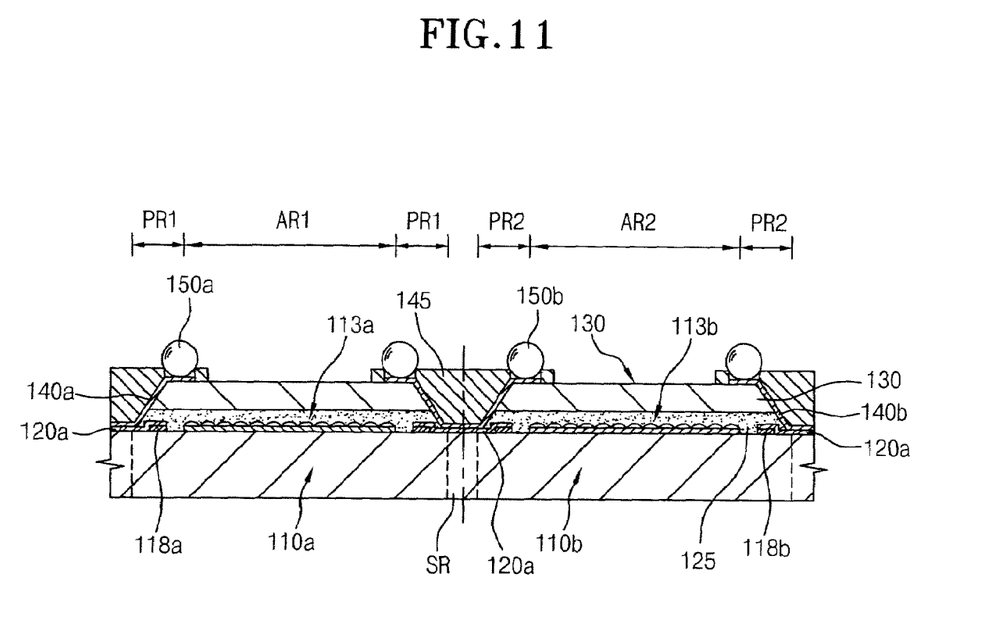

Referring to FIG. 11, after the transparent substrate 130 is etched, first and second re-distribution layers 140a and 140b are formed and have a line shape. An end of each of the first and second re-distribution layers 140a and 140b is electrically connected to a respective preliminary connecting layer 120a. The opposite end of each of the first and second re-distribution layers 140a and 140b is extended to the top surface of the transparent substrate 130 along the inclined side surface of the transparent substrate 130. The first and second re-distribution layers 140a and 140b may be formed, for example, through a photolithography process or a plating process.

After the first and second re-distribution layers 140a and 140b are formed, an organic layer 145 is formed on the resulting structure so as to cover a portion corresponding to the scribe region SR, i.e., the side surfaces of the transparent substrate 130. The organic layer 145 covers portions of the first and second re-distribution layers 140a and 140b disposed on the top surface of the transparent substrate 130.

First and second connecting members 150a and 150b are formed on the first and second re-distribution layers 140a and 140b exposed by the organic layer 145, respectively. For example, the first and second connecting members 150a and 150b may include a metal having a low melting point, such as solder.

After the first and second connecting members 150a and 150b are formed on the first and second re-distribution layers 140a and 140b, respectively, the scribe region SR is cut, thereby defining and substantially completing the manufacture of first and second image sensor modules having the first and second semiconductor chips 110a and 110b, respectively.

A circuit substrate and a holder may be additionally combined with the first and second image sensor modules.

As described above, connecting members are disposed on a transparent substrate having photodiode units formed thereon, so that the size of an image sensor module can be decreased, and the image sensor module can be applied to various types of devices.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. An image sensor module, comprising:
   a semiconductor chip comprising:
   photodiode units disposed in an active region converting light into electric signals;
   pads disposed in a peripheral region formed around the active region and electrically connected to the photodiode units; and
   a connecting region formed around the peripheral region;
   re-distribution layers electrically connected to the pads and extended to the connecting region;
   a transparent substrate covering the photodiode units and the pads, wherein at least a portion of each of the re-distribution layers is exposed from the transparent substrate;
   connecting layers electrically connected to the re-distribution layers and extended to a top surface of the transparent substrate; and
   connecting members electrically connected to the connecting layers disposed on the top surface of the transparent substrate.

2. The image sensor module according to claim 1, wherein each of the photodiode units comprises:
   a photodiode converting light into electric signals;
   a driving unit having a driving transistor driving the photodiode;
   a color filter disposed over the photodiode; and
   a condensing member disposed over the color filter.

3. The image sensor module according to claim 1, wherein the transparent substrate includes any one of a transparent glass substrate, a transparent quartz substrate, and a transparent synthetic resin substrate.

4. The image sensor module according to claim 1, wherein an angle made by the top surface of the transparent substrate and a side surface connected to the top surface of the transparent substrate is an obtuse angle.

5. The image sensor module according to claim 1, further comprising a transparent adhesion member interposed between the transparent substrate and the semiconductor chip.

6. The image sensor module according to claim 1, further comprising at least one lens unit disposed at a portion of the top surface of the transparent substrate corresponding to the active region.

7. The image sensor module according to claim 1, further comprising a circuit substrate, the circuit substrate comprising:
   a first opening exposing the active region; and
   connecting pads disposed around the first opening wherein the connecting pads are electrically connected to a connecting member of the connecting members.

8. The image sensor module according to claim 7, further comprising a holder surrounding the semiconductor chip and the circuit substrate, wherein the holder includes a second opening exposing the first opening of the circuit substrate.

9. The image sensor module according to claim 1, wherein the transparent substrate comprises:
   a first transparent substrate portion corresponding to the active region, the first transparent substrate portion having a first thickness; and
   a second transparent substrate portion corresponding to the peripheral region, the second transparent substrate portion having a second thickness,
   wherein the first thickness is greater than the second thickness.

10. An image sensor module, comprising:
    a semiconductor chip comprising:
    photodiode units disposed in an active region converting light into electric signals; and pads disposed in a peripheral region formed around the active region and electrically connected to the photodiode units;

a transparent substrate comprising:
- a first transparent substrate portion corresponding to the active region, the first transparent substrate portion having a first thickness;
- a second transparent substrate portion corresponding to the peripheral region, the first transparent substrate portion having a first thickness, wherein the first thickness is greater than the second thickness;
- a transparent substrate body covering the photodiode units and the pads and having through-holes exposing at least a portion of each of the pads;
- through-electrodes electrically connected to the pads exposed through the through-holes; and
- connection members connected to the through-electrodes, respectively.

11. The image sensor module according to claim 10, wherein the transparent substrate includes any one of a transparent glass substrate, a transparent quartz substrate, and a transparent synthetic resin substrate.

12. The image sensor module according to claim 10, further comprising a transparent adhesion member interposed between the transparent substrate and the semiconductor chip.

13. The image sensor module according to claim 10, further comprising at least one lens unit disposed at a portion of a top surface of the transparent substrate corresponding to the active region.

14. The image sensor module according to claim 10, further comprising a circuit substrate comprising:
- a first opening exposing the active region; and
- connecting pads disposed around the first opening, wherein the connecting pads are electrically connected to the connecting members.

15. The image sensor module according to claim 14, further comprising a holder surrounding the semiconductor chip and the circuit substrate, wherein the holder includes a second opening exposing the first opening of the circuit substrate.

* * * * *